United States Patent
Dalvi

(10) Patent No.: US 8,121,240 B1
(45) Date of Patent: Feb. 21, 2012

(54) STATISTICAL MEASUREMENT OF AVERAGE EDGE-JITTER PLACEMENT ON A CLOCK SIGNAL

(75) Inventor: Ajay Dalvi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1637 days.

(21) Appl. No.: 10/990,045

(22) Filed: Nov. 16, 2004

(51) Int. Cl.
 *H04L 7/00* (2006.01)
 *H04L 25/00* (2006.01)
 *H04L 25/40* (2006.01)

(52) U.S. Cl. ........................................ 375/371

(58) Field of Classification Search ............ 324/76.253; 327/141; 375/371
See application file for complete search history.

(56) References Cited

U.S. PATENT DOCUMENTS

| | | | | |
|---|---|---|---|---|
| 5,410,263 A * | 4/1995 | Waizman | ...................... | 327/141 |
| 6,734,703 B1 * | 5/2004 | Alfke et al. | ..................... | 326/38 |
| 6,734,748 B2 * | 5/2004 | Livezey | ........................ | 331/158 |
| 6,841,985 B1 * | 1/2005 | Fetzer | ........................ | 324/76.53 |
| 2002/0000855 A1 * | 1/2002 | Lee | ................. | 327/158 |
| 2003/0167368 A1 * | 9/2003 | Tanaka | ........................ | 710/305 |
| 2004/0160530 A1 * | 8/2004 | Suzuki | ......................... | 348/536 |
| 2005/0068110 A1 * | 3/2005 | Hui et al. | ...................... | 331/1 A |

OTHER PUBLICATIONS

U.S. Appl. No. 10/990,032, filed Nov. 16, 2004, Dalvi.

* cited by examiner

*Primary Examiner* — David C. Payne
*Assistant Examiner* — Tanmay Shah
(74) *Attorney, Agent, or Firm* — Scott Hewett; Michael R. Hardaway; LeRoy D. Maunu

(57) ABSTRACT

Phase shift is added between a uttering clock signal and a data bit stream clocked by the clock signal. The phase shift is adjusted until half the data bits are captured (counted) over a measurement period. Adding this amount of phase shift between the clock and data signals centers the average clock edge placement. In a particular embodiment, counters, each having N bits where N is an integer, are used to count clock pulses and data bits. When one counter is full and the most-significant bit on the other counter goes high, the phase shift between the data and clock signal places the average clock edge at the data bit edge.

20 Claims, 2 Drawing Sheets

STATISTICAL MEASUREMENT OF AVERAGE EDGE-JITTER PLACEMENT ON A CLOCK SIGNAL

FIELD OF THE INVENTION

The present invention relates generally to digital logic devices having a digital clock signal, and more particularly to characterizing edge jitter of the digital clock signal.

BACKGROUND OF THE INVENTION

Digital electronic logic devices, such as microprocessors, field-programmable gate arrays ("FPGAs"), complex logic devices ("CPLDs"), and application-specific integrated circuits ("ASICs") use a digital clock signal to synchronize operations of different portions of the logic device. However, the digital clock signal accumulates various amounts of delay as it travels along different paths. Variation in when a clock pulse occurs because of delay is called clock skew. Clock skew (also called "phase skew") is intentional in some cases, such as in the outputs of a digital clock manager ("DCM"). For example, a DCM might provide clock outputs with zero phase skew, ninety degrees of phase skew, one-hundred and eighty degrees of phase skew, and two-hundred and seventy degrees of phase skew. It is very desirable to characterize clock skew in a digital electronic device for various paths of the clock signal; however, clock skew can be obscured by clock jitter.

Jitter causes successive clock pulses to occur slightly before or slightly after the expected clock pulse. Thus, it is important to remove the contribution of jitter when measuring clock skew. One way to characterize jitter of a clock signal is to measure the edge placements of several successive clock pulses using a test instrument, such as a high-speed oscilloscope, and then average the edge placement (time) to determine the average clock timing. Such measurements are often done on a test bench and take a relatively long time. This often results in such measurements of clock skew being made on relatively few units. It is desirable to be able to perform clock timing averaging on more units, and particularly desirable to be able to perform clock timing averaging and associated clock skew measurements in an ATE environment.

SUMMARY OF THE INVENTION

Phase shift is added between a jittering clock signal and a data bit stream clocked by the clock signal. The phase shift is adjusted until half the data bits are captured (counted) over a measurement period. Adding this amount of phase shift between the clock and data signals centers the average clock edge placement. In a particular embodiment, counters, each having N bits where N is an integer, are used to count clock pulses and data bits. When one counter is full and the most-significant bit on the other counter goes high, the phase shift between the data and clock signal places the average clock edge at the data bit edge. In alternative embodiments, more or less phase shift places the clock edge to capture a different fraction of bits in the data stream.

DETAILED DESCRIPTION OF THE DRAWINGS

The present invention enables on-chip clock averaging, which in turn enables accurate clock skew measurements in an ATE environment. Independent clock and data signals are provided to the IC, and the timing of one signal is delayed with respect to the other. Delay is provided by an external data source, an external clock source, or with an on-chip programmable delay line.

The data signal is a series of data bits (e.g. a series of "1s" or "0s") that provide a series of edges from a first digital logic state to a second digital logic state. A first counter counts the total number of clock cycles, and a second counter counts the outputs of a flip-flop triggered by the same clock signal. If the data value is active when the clock pulse enables the flip-flop, the data is passed to the second counter. If the clock signal does not enable the flip-flop when the data value is active, a value is not passed to the second counter. The phase relation between the data signal and the clock signal is varied until half the data values are being passed to the second counter. The average edge placement of the clock signal occurs at this condition.

Figure 1:
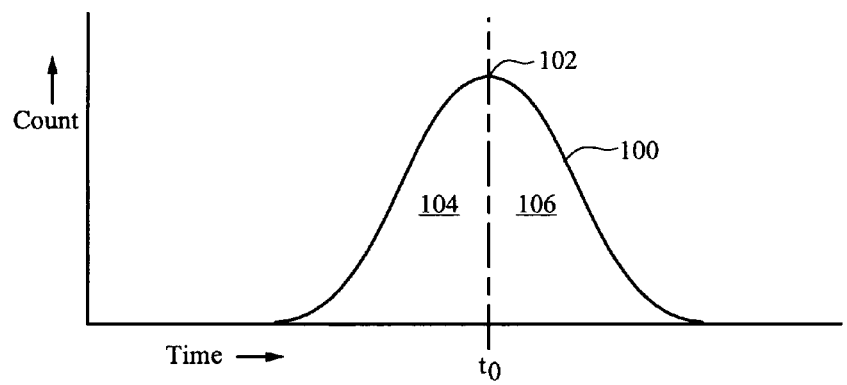
FIG. 1 is a plot of counts versus time for a clock edge pulse.

FIG. 1 is a plot 100 of counts versus time for a clock edge pulse. The plot 100 shows a normal Gaussian distribution with an average time 102 occurring in the middle of the distribution; however, this distribution is merely exemplary. The average time is the time that can be used to accurately determine skew of the clock signal because it indicates the proper phase shift (time delay or advance) to add to the clock signal to synchronize the middle of the uttering clock signal with the data stream. In a normal distribution, half the values (data bits) 104 occur before the average time 102, and half the values (data bits) 106 occur after the average time 102.

Figure 2A:
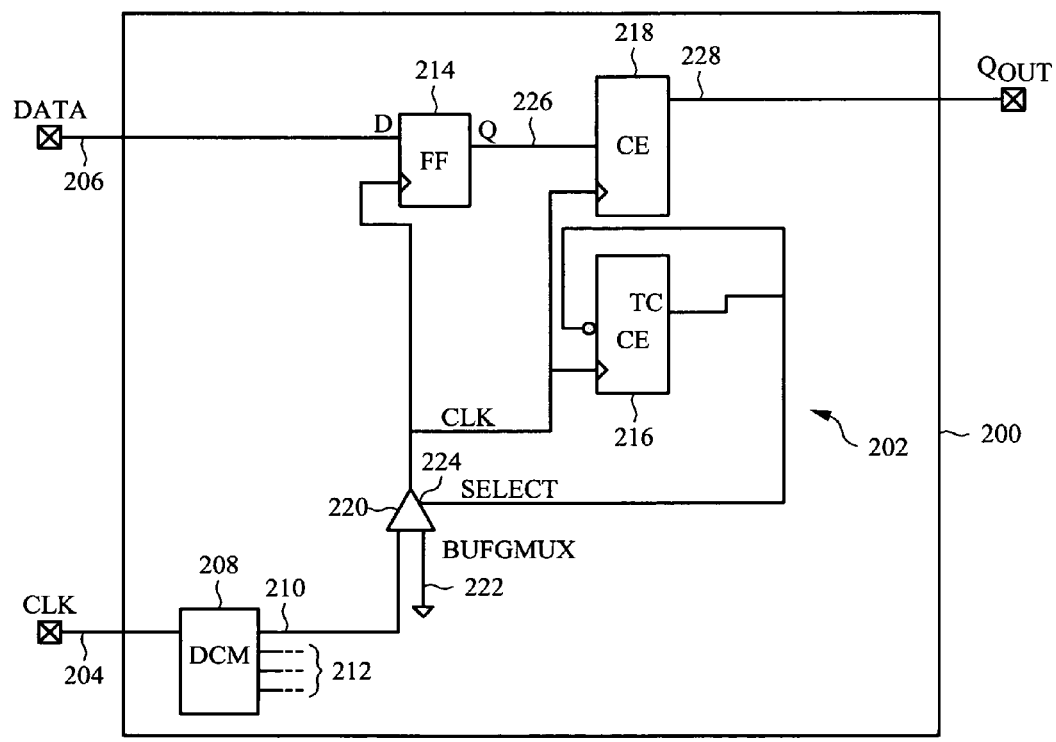
FIG. 2A is a simplified circuit diagram of a digital logic device with a jitter measurement circuit according to an embodiment of the present invention.

FIG. 2A is a simplified circuit diagram of a digital logic device 200 with a jitter measurement circuit 202 according to an embodiment of the present invention. A clock signal (CLK) 204 and a data signal (DATA) 206 are provided to the digital logic device 200 from an external instrument(s) (not shown), such as a digital ATE tester or test station. The data signal is capable of being phase shifted relative to the clock signal, or vice versa. For purposes of discussion, it will be assumed that the clock signal is stable, and that the phase of the data signal will be shifted. In other embodiments, the data signal is stable and the clock signal is shifted, or both the data and clock signals are shifted.

The clock signal 204 drives a DCM 208, which has a clock output 210, and optionally additional clock outputs 212. For example, the clock output 210 might provide a local clock signal that is one-hundred and eighty degrees out of phase with the clock signal 204. The clock output 210 is provided to a flip-flop 214, a reference counter 216, and a statistical counter 218 through a clock signal multiplexer 220. In a particular embodiment, the counters are ripple counters.

In one embodiment, the reference counter 216 and statistical counter 218 have the same number of bits. The reference counter 216 counts the number of clock edges and, upon reaching a terminal count (i.e. counter full or other selected count), shuts off the clock output signal from the clock signal multiplexer 220 by choosing the ground signal 222 through the select pin 224. The statistical counter 218 counts the edges of the clock output signal 210 only when 0 is high. The data signal 206 is phase shifted until the statistical counter 218 captures fifty percent (half) of the total counts captured by the reference counter 216, namely when the data output (Q) 226 has been high for fifty percent of the clock edges.

In an alternative embodiment, the counters do not have the same number of bits, for example, the reference counter has twice as many bits as the statistical counter, or the reference and statistical counters have arbitrary numbers of bits, and additional logic (not shown) is employed to compare the two counter outputs and produce a signal when half the data values are counted over a number of clock cycles. Similarly, alternative embodiments indicate when the statistical buffer counts a different fraction of the data bits over the count period. For example, phase shift is applied until the statistical counter captures 25%, 75%, 100%, or some other fraction of the data bits in the data stream. For example, in a three-bit counter, a 25% condition is captured by stopping the clock when the third bit is low and the second bit goes high (count=2), and a 75% condition is captured by stopping the clock when the third bit is high and the second bit goes high (count=6), etc. Determining the relative phase skew where 50% of the data bits are counted is particularly valuable for making subsequent phase and skew measurements because it correctly synchronizes the clock and data signals by providing an average edge placement, which minimizes the measurement uncertainties arising from clock (and/or data) edge jitter.

In an actual test environment, the phase shift between the data and clock signals will have a minimum increment that is determined by the phase shifting element (e.g. delay line). Stepping the phase shift by the minimum increment from just under the half-count point might result in the statistical buffer filling to over the half-count. If the actual clock pulses and data bit counts are evaluated, it is possible to interpolate where the phase shift occurs that provides the half-count. In a digital system where a single line is used to output a digital value, the phase shift that provides the average clock edge placement is approximated according to the resolution of the phase shift element.

In the digital device 200, the statistical counter 218 automatically stops counting data when the reference counter 216 is full because the clock signal multiplexer 220 is disabled, thus shutting off the clock signal to the statistical counter 218. The count generated by the reference counter when it is full (e.g. the signal provided to the selected pin 224 that disables the clock signal multiplexer 220) is called the "terminal count," which stops the statistical counter from counting any more data because it is clocked off the same clock signal as the reference counter.

The statistical counter output ($Q_{out}$) 228 is evaluated when the terminal count is provided. In some embodiments, the statistical counter output provides the total data count, which is then compared to the known size of the reference counter to determine if it is greater than or less than half the number of clock pulses counted by the reference counter. In an alternative embodiment, the most significant bit (MSB) of the statistical counter from the statistical counter output is evaluated at $Q_{out}$ to determine when the MSB (which is initialized to "0") changes state to "1." $Q_{out}$ is evaluated by an external test instrument, for example. Alternatively, $Q_{out}$ is coupled to on-chip logic for evaluation.

For example, in embodiments where the statistical and reference counters have the same number of bits (e.g. both are 3-bit counters, which are capable of counting to eight), the fifty percent point of the statistical counter is reached when the MSB first reaches a value of "1." For example, the statistical counter starts at 000, then increments to 001, 010, 011, and 100. When the fourth value is counted, the most significant bit toggles from a "0" to a "1" (i.e. from 011 to 100). Thus, when the $N^{th}$ bit goes high, where the $N^{th}$ bit is the most significant bit in an N-bit counter, we know that half the data counts have been captured by the statistical counter. Detecting the transition of the $N^{th}$ bit is a convenient and simple way of determining when the statistical counter is half full.

The reference counter counts the clock counts. When the reference counter is full (e.g. 111, or eight counts, for a 3-bit counter), the most significant bit on the statistical counter is evaluated to determine if it is a "0" or a "1." If the most significant bit of the statistical counter is a "0", additional phase skew is added to the data signal, the reference counter is reset, and the process is repeated. If the most significant bit of the statistical counter is "1", the phase skew of the data signal is reduced, the reference counter is reset, and the process is repeated. Thus the average edge placement of the clock signal is determined by finding delay at which the MSB of the statistical counter transitions from one state to the other.

The resolution of the measurement depends on many factors, such as the resolution of phase shifting in the data source instrument and the number of bits in the counters. Similarly, the desired or necessary resolution might be determined according to component and/or test specifications. Generally, a high degree of resolution is desired to improve (i.e. reduce the measurement guard band) subsequent clock skew measurements. Having large counters without the ability to provide data skew in sufficiently small increments can result in taking unduly long to fill the reference counter.

In some embodiments, the size of the counters in the logic device is selected to provide sufficiently high accuracy in measuring the average clock edge placement for a particular application of the logic device. In some embodiments, the counters are embedded in the logic device, and in other embodiments, the counters are configured in the fabric of a programmable logic device. In the latter case, the counters can be reconfigured according to the intended application/test accuracy.

For example, if a device has a very tight clock skew specification for some applications, it might justify taking more test time to provide a highly accurate average clock jitter measurement, and large counters are configured. If the clock skew measurement is less critical for other applications, smaller counters are configured to reduce test time. The test instrument providing the phase-shifted data signal is generally chosen to have resolution equal to or better than the clock edge placement measurement accuracy available from the counters. In other cases, the counters are relatively large, and the clock edge placement measurement accuracy is limited by the phase-shift resolution of the data source. Alternatively, data is provided externally and selectively phase-shifted using an on-chip delay line (not shown).

Figure 2B:
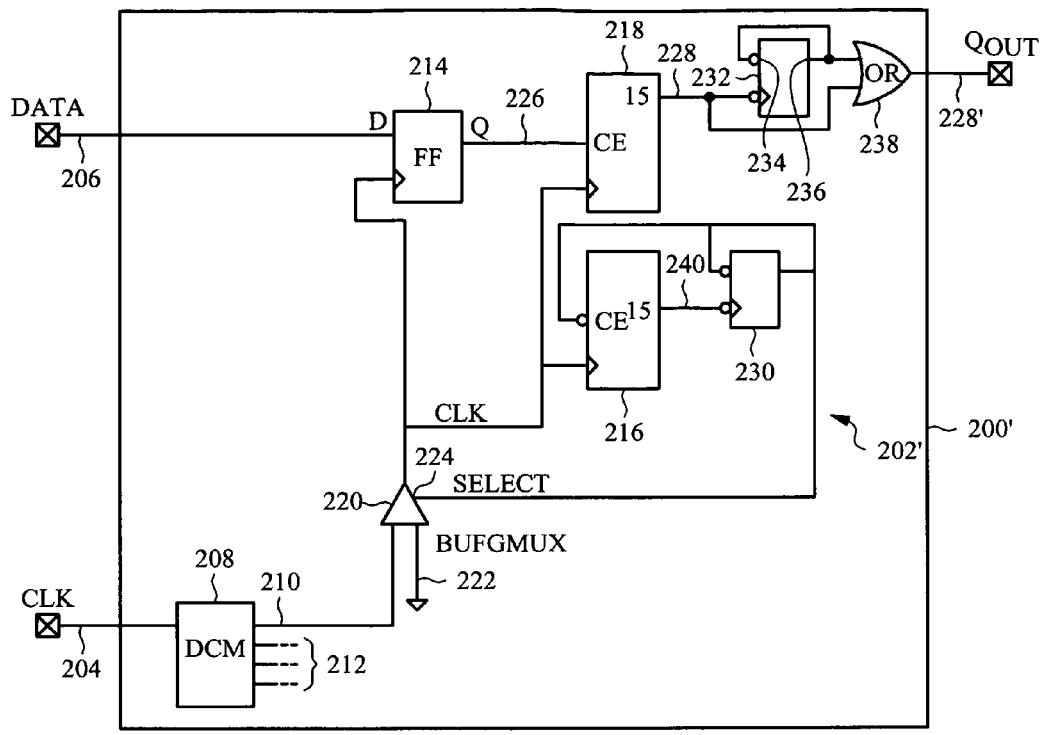
FIG. 2B is a simplified circuit diagram of a digital logic device with a jitter measurement circuit according to another embodiment of the present invention.

FIG. 2B is a simplified circuit diagram of a digital logic device 200' with a jitter measurement circuit 202' according to another embodiment of the present invention. Additional bits 230, 232 are added to the counter outputs, which doubles the number of counts monitored and helps facilitate evaluation of the in the event the statistical counter 218 overflows.

For example, when the reference counter produces the terminal count, the statistical counter might overflow if every data bit was counted (100% data count), causing the MSB to become "0." The additional bit 232 insures that Qout 228' is "1," even if the statistical counter overflows, and indicates that at least half the data values have been counted during the count period (i.e. between start of counting and the terminal count from the reference counter), which is true if 100% of the data bits are counted. Thus, even though the MSB of the statistical counter 218 is "0," a Qout value of "1" indicates that the data should be phase shifted so that fewer data counts are made during the count period. Otherwise, the data signal might be shifted to try and increase the data count, which would be a phase shift in the wrong direction.

In one embodiment, the counters 216, 218 are both 16-bit ripple counters (having bits 0-15), which are triggered on the falling edge of the clock signal and count up from zero. Thus, bit fifteen is the MSB of each counter; however, the outputs of the additional bits 230, 232 provide essentially 17-bit counters. The bits 230, 232 are initialized to "0." The data output 236 of bit 232 is fed back to the data input 234 and inverted to a "1," so that a "1" is present at the data input 234 of bit 232. When the MSB (bit 15) of the statistical counter 218 goes high, it presents a "1" to an OR gate 238 and hence to the Qout 228'. In an overflow condition, the MSB returns to "0" value, and the falling edge enables bit 232. The "1" present at the data input 234 of the bit 232 is coupled to the data output 236, and then to the OR gate 238. Thus, Qout 228' goes high and stays high even if the MSB (bit 15) of the statistical counter returns to "0," such as in an overflow condition.

Similarly, bit 230, which is initialized to "0," outputs a "0" to keep the clock signal multiplexer 220, and hence the clock signal to the counters 216, 218, enabled. When the bit 15 output 240 of the reference counter 216 goes high, and then transitions to low, bit 230 is enabled, and the buffer/multiplexer 220 is shut off, stopping the counters 216, 218. Alternatively, the counters are shift registers or binary counters. In some embodiments, the statistical counter is one type and/or size of counter, and the reference counter is another type and/or size of counter.

Figure 3:
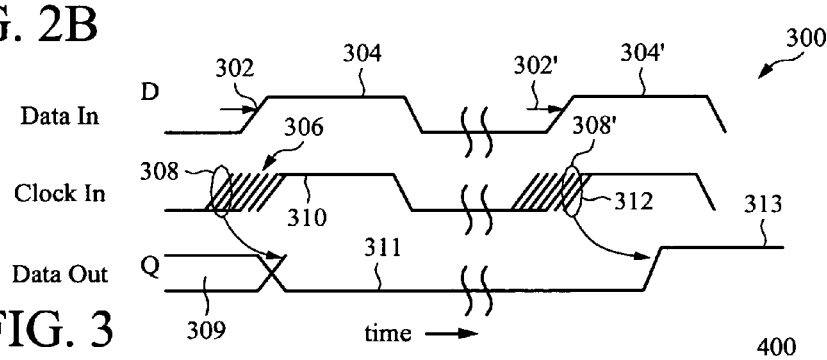
FIG. 3 is a timing diagram illustrating a method of the present invention.

FIG. 3 is a timing diagram 300 illustrating a method of the present invention. When the rising edge 302 of a data value 304 is positioned in the middle of the uttering clock 306 (plus the internal setup time of an input flip-flop (see FIG. 2A, ref. num. 214)), half of the clock edges will pass the data value of "1" and half the clock edges will not pass the "1," but rather will pass a "0." In other words, when the rising edge 302 of the data input signal occurs after the clock edge 308 (i.e. when the clock pulse 310 goes high), the data output (Q) starting from an indeterminate state 309 (i.e. either a high or a low state) goes/remains low 311. In other words, the data value 304 is not captured by the statistical counter (see FIG. 2A, ref. num. 218). When the rising edge 302' of the data input signal occurs before the clock edge 308', the data value 304' is coupled to the data output 313, which goes high and is captured by the statistical counter. With a 16-bit [0:15] counter, the fifty-percent point will be reached when bit 15 on the statistical counter goes high, which can be sent to a tester pin for monitoring. Thus, the data signal is delayed relative to the clock signal if the statistical counter is less than half full.

One technique initially sets the timing of the data signal relative to the clock signal so that much less than half the total bits in the data stream over the count period are counted by the statistical counter. The phase shift is increased in relatively large increments until the statistical counter counts more than half the total bits, and then is decreased in smaller increments until statistical counter counts less than half the total bits, and so forth until the resolution of the phase-shifting element is reached.

In other words, the phase shift at which the statistical counter counts half the data bits over the count period is bracketed, and then the point at which the statistical counter transitions from counting less than half the total bits to half or more of the total bits is determined by the finest step size of the phase shifter. A single phase shift step from just under a 50% count might result in more than 50% of the bits being counted; however, the phase shift at this transition point is the closest obtainable to achieve the average clock placement edge with that phase shifter. A phase shifter having higher resolution might provide a more accurate average of the clock placement edge.

Figure 4:
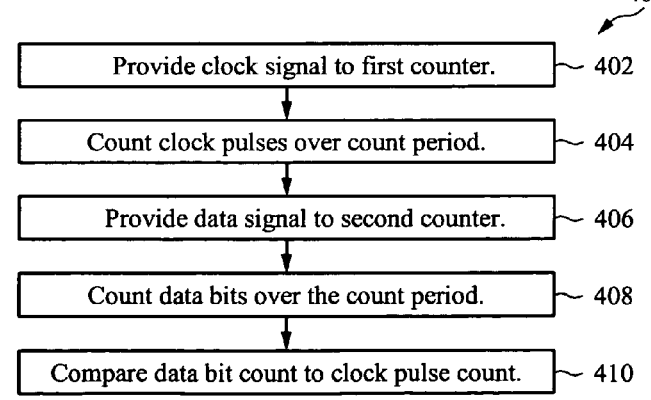
FIG. 4 is a flow chart of a method of determining the average edge jitter placement on a clock signal.

FIG. 4 is a flow chart of a method 400 of determining the average edge jitter placement on a clock signal. A clock signal is provided to a first counter (step 402) and a first number of clock pulses is counted over a count period (step 404). A data signal having a selected phase shift relative to the clock signal is provided to a second counter (step 406), and a second number of data bits clocked by the clock signal is counted over the count period (step 408). The data signal is a data bit stream of "1s," for example. The second number of data bits is compared to the first number of clock pulses to determine whether the second number of data bits equals half (or at least half in some embodiments) the first number of clock pulses (step 410).

The first and second numbers are compared by evaluating their full values, or by monitoring a digital value. For example, a first counter shuts off the second counter when the first counter is full, and the second counter is polled to determine whether it is half full or not. In other embodiments, different techniques are used.

While the present invention has been described in connection with specific embodiments, variations of these embodiments will be obvious to those of ordinary skill in the art. For example, alternative embodiments use analog phase shifting elements for providing phase shifting of the data and clock signals. Similarly, although specific embodiments have been described with reference to ripple counters, other types of counters, such as shift registers or binary counters, are used in alternative embodiments, or other types of data signals are used. Therefore, the spirit and scope of the appended claims should not be limited to the foregoing description.

The invention claimed is:

1. A digital logic device comprising:
   a first counter clocked by a clock signal and configured to count a first number of clock pulses of the clock signal;
   a second counter clocked by the clock signal and configured to count a second number of data bits in a data signal, the data signal and the clock signal being selectively phase-shifted relative to each other;
   wherein the first counter is an M-bit counter, the second counter is an N-bit counter, and M and N are greater than 2; and
   an output indicating a value of the counted second number of data bits in response to the counted first number of clock pulses reaching a selected count.

2. The digital logic device of claim 1 wherein the selected count is a maximum capacity of the first counter.

3. The digital logic device of claim 1 wherein M is equal to N.

4. The digital logic device of claim 3 wherein the output is coupled to the most-significant bit of the second N-bit counter.

5. The digital logic device of claim 1 wherein the value is the second number of data bits.

6. The digital logic device of claim 1 further comprising a clock signal multiplexer coupling the clock signal to the first counter and to the second counter.

7. The digital logic device of claim 6 further comprising a select pin of the clock signal multiplexer coupled to the first counter so as to disable the clock signal to the second counter when the first counter reaches the selected count.

8. The digital logic device of claim 1 further comprising a digital clock manager providing the clock signal to the first counter and to the second counter.

9. The digital logic device of claim 1 further comprising a bit clocked by a counter output of the second counter disposed between the second counter and the output.

10. The digital logic device of claim 9 further comprising an OR gate coupled to a data output of the bit and to the counter output, and to the output.

11. The digital logic device of claim 1 wherein the data signal comprises a series of edges from a first digital logic state to a second digital logic state.

12. The digital logic device of claim 1 further comprising a flip-flop clocked by the clock signal and coupled to the data signal and providing a data output signal to the second counter.

13. The digital logic device of claim 1 wherein a selected delay between the data signal and the clock signal is provided by a programmable delay line of the programmable logic device.

14. A method of determining average clock edge placement comprising:
  providing a clock signal to a first counter;
  counting a first number of clock pulses of the clock signal over a period;
  providing a data signal having a selected phase shift relative to the clock signal to a second counter;
  counting a second number of data bits clocked by the clock signal over the period;
  wherein the counting of the first number is with an M-bit first counter, the counting of the second number is with an N-bit second counter, M and N are greater than 2, and the first counter and the second counter are clocked by the clock signal; and
  determining whether the second number of data bits equals one-half the first number of clock pulses in response to reaching an end of the period.

15. The method of claim 14 wherein the period ends in response to the first counter reaching a maximum count.

16. The method of claim 14 wherein the first counter turns off the clock signal in response to the first counter reaching a maximum count, and wherein the output is coupled to a most-significant bit of the second counter.

17. The method of claim 14 further comprising, in response to the second number of data bits being not equal to one-half the first number of clock pulses:
  changing the selected phase shift; and
  repeating the steps of:
    counting of the first number of clock pulses over the period;
    counting of the second number of data bits over the period; and
    determining whether the second number of data bits equals one-half the first number of clock pulses in response to reaching an end of the period.

18. The method of claim 17 wherein the selected phase shift is increased or decreased according to whether the second number of data bits is less than or not less than half the first number of clock pulses.

19. A system of determining average clock edge jitter comprising:
  means for counting a first number of clock pulses over a period;
  means for counting a second number of data bits in a data bit stream over the period;
  wherein the means for counting the first number includes an M-bit first counter, the means for counting the second number is an N-bit second counter, and M and N are greater than 2;
  means, responsive to the counted first number of clock pulses reaching a selected count, for outputting a value of the counted second number of data bits; and
  means, responsive to the output value of the counted second number of data bits, for determining whether the second number of data bits is about one-half the first number of clock pulses.

20. The device of claim 1, wherein the second counter is further configured to count edges of the clock signal in response to the data signal being in a first state at the edges of the clock signal.

* * * * *